(12) United States Patent
Sarpatwari et al.

(10) Patent No.: US 9,196,357 B2
(45) Date of Patent: Nov. 24, 2015

(54) VOLTAGE STABILIZING FOR A MEMORY CELL ARRAY

(71) Applicant: Micron Technology, Inc., Boise, ID (US)

(72) Inventors: Karthik Sarpatwari, Boise, ID (US); Hongmei Wang, Boise, ID (US); Rangan Sanjay, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 32 days.

(21) Appl. No.: 14/137,189

(22) Filed: Dec. 20, 2013

(65) Prior Publication Data

US 2015/0179255 A1    Jun. 25, 2015

(51) Int. Cl.
*G11C 7/10* (2006.01)
*G11C 13/00* (2006.01)
*G11C 7/02* (2006.01)
*G11C 8/08* (2006.01)
*G11C 7/12* (2006.01)

(52) U.S. Cl.
CPC ............. *G11C 13/0038* (2013.01); *G11C 7/02* (2013.01); *G11C 8/08* (2013.01); *G11C 7/12* (2013.01)

(58) Field of Classification Search
USPC ................................. 365/148, 203
See application file for complete search history.

(56) References Cited

U.S. PATENT DOCUMENTS

| 6,104,665 | A  | * | 8/2000  | Hung et al. ............... 365/230.06 |
| 6,449,187 | B1 |   | 9/2002  | Salling et al. |
| 8,248,875 | B2 |   | 8/2012  | Kajigaya |
| 8,315,083 | B2 |   | 11/2012 | Wang et al. |
| 8,488,380 | B2 |   | 7/2013  | Do |

* cited by examiner

*Primary Examiner* — Hoai V Ho
(74) *Attorney, Agent, or Firm* — Brooks, Cameron & Huebsch, PLLC

(57) ABSTRACT

Voltage balancing for a memory cell array is provided. One example method of voltage balancing for a memory array can include activating an access node coupled to a row of a memory array to provide voltage to the row of the memory array, activating a stabilizing transistor coupled to the row of the memory array to create a feedback loop, and activating a driving node coupled to a column of the memory array, wherein activating the driving node deactivates the stabilizing transistor once the column reaches a particular voltage potential.

27 Claims, 4 Drawing Sheets

US 9,196,357 B2

VOLTAGE STABILIZING FOR A MEMORY CELL ARRAY

TECHNICAL FIELD

The present disclosure relates generally to semiconductor memory devices and methods, and more particularly to voltage stabilizing for a memory cell array.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), flash memory, phase change random access memory (PCRAM), spin torque transfer random access memory (STTRAM), resistive random access memory (RRAM), magnetoresistive random access memory (MRAM; also referred to as magnetic random access memory), conductive-bridging random access memory (CBRAM), among others.

Some types of memory devices can be non-volatile memory and can be used for a wide range of electronic applications in need of high memory densities, high reliability, and low power consumption. Non-volatile memory may be used in a personal computer, a portable memory stick, a solid state drive (SSD), a personal digital assistant (PDA), a digital camera, a cellular telephone, a smartphone, a tablet, a portable music player, e.g., MP3 player, a movie player, and other electronic devices, among others. Program code and system data, such as a basic input/output system (BIOS), are typically stored in non-volatile memory devices.

Many memory devices, such as RRAM, PCRAM, MRAM, STTRAM and CBRAM, for example, can include arrays of memory cells organized in a two-terminal cross-point architecture, for instance. Arrays of memory cells in a two-terminal cross-point architecture can include electrodes that have planar surfaces between the memory cell material. For filamentary-type memory devices, e.g., RRAM and/or CBRAM, the location of the active region of the memory cell between planar surfaces of the electrodes can be variable because the planar surfaces of the electrodes provide a substantially uniform electric field across the memory cell material.

DETAILED DESCRIPTION

Figure 1:
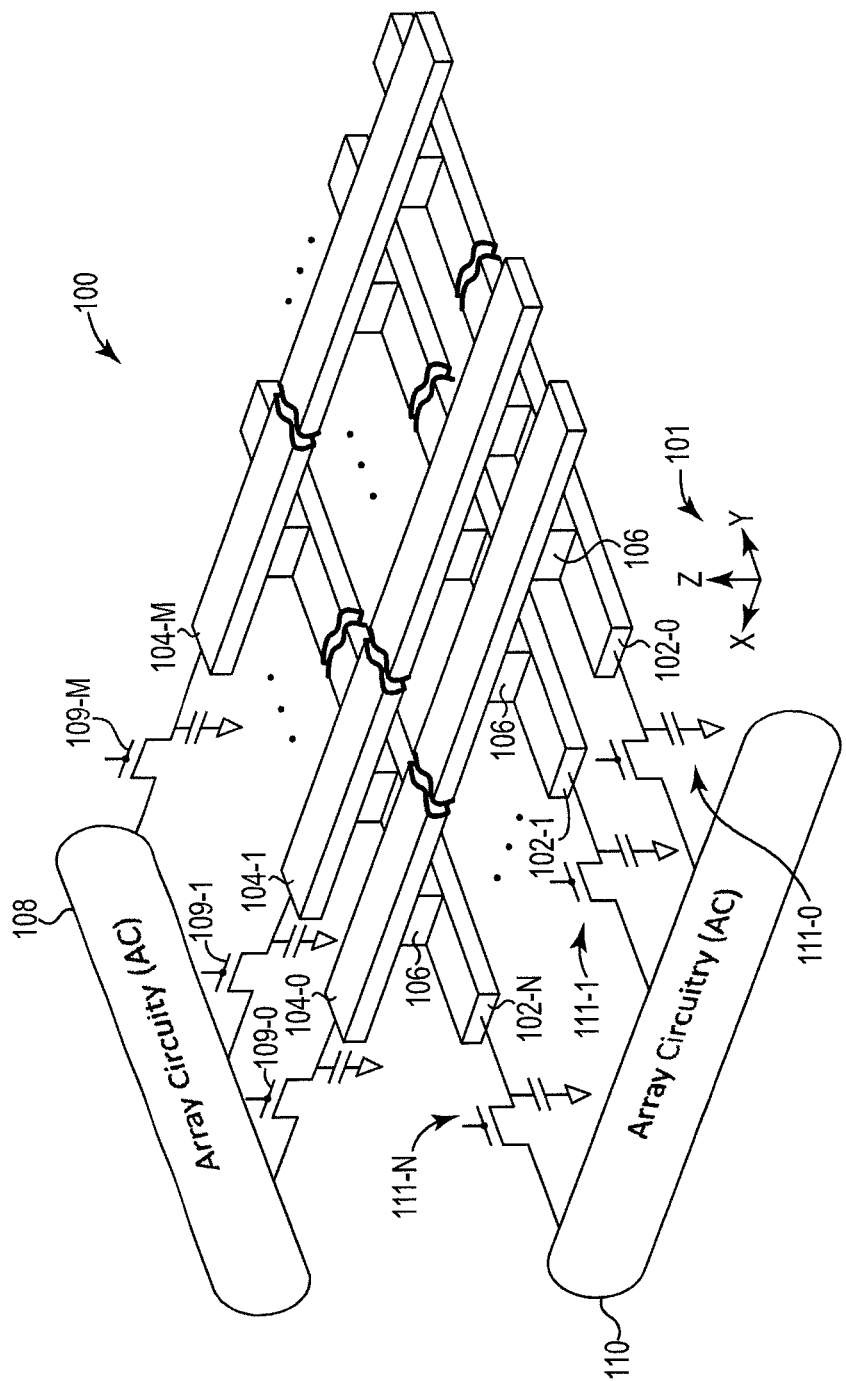
FIG. 1 illustrates a block diagram illustrating portions of a cross point memory array architecture according to the prior art.

The present disclosure includes memory cell array structures. In a number of embodiments the memory cell array structures include a number of intersecting conductive lines with a number of memory cells at the intersecting points. The memory array structures include power supplies e.g., power source, that provide electrical power e.g., voltage, to the conductive lines. The memory array can utilize a number of transistors to control when a conductive line is provided voltage and when a conductive line is not provided voltage.

The memory array can utilize a charged conductive line. A charged conductive line can be charged using an access transistor to connect the conductive line to a power supply. The charged conductive line can then be "floated" meaning that the access transistor connecting the charged conductive line to the power supply is turned off. The floated, e.g., floating, conductive line can be exposed to leakage from a number of other conductive lines within the memory array. The leakage can be in the form of current leakage and/or capacitive voltage coupling from other conductive lines that alters or changes the voltage of the floating conductive line. The altered voltage of the floating conductive line can decrease an intended gap voltage between the charged, floating conductive line and a number of other conductive lines.

Preventing a decrease in the gap voltage e.g., reducing or compensating for voltage and/or current leakage, between the floating conductive line and the number of other conductive lines is accomplished by utilizing a stabilizing transistor configuration as described herein. The stabilizing transistor reacts to a change in the particular voltage of the charged, floating conductive line and provides feedback voltage to the conductive line to attempt to maintain a particular voltage on the charged conductive line and prevent a decrease in the intended gap voltage e.g., prevent leakage effect or compensate for leakage. As such, embodiments can improve read operation accuracy for memory cells and/or memory cell arrays as compared to other approaches, among other benefits.

As used herein, "a number of" something can refer to one or more such things. For example, a number of memory devices can refer to one or more memory devices. Additionally, the designators "N" and "M", or other letters as used herein, particularly with respect to reference numerals in the drawings, indicates that a number of the particular feature so designated can be included with a number of embodiments of the present disclosure. The designators "N" and "M" may be equal or different in number.

The figures herein follow a numbering convention in which the first digit or digits correspond to the drawing figure number and the remaining digits identify an element or component in the drawing. Similar elements or components between different figures may be identified by the use of similar digits. For example, element 100 in FIG. 1 can represent the same and/or similar element as element 200 in FIG. 2.

FIG. 1 illustrates a perspective view of a portion of a memory array 100 in accordance with a cross point memory array architecture. In this example, the array 100 is a cross-point array 100 including memory cells 106 at the intersections of a first number of conductive lines 102-0, 102-1, . . . , 102-N, e.g., access lines, which may be referred to herein as word lines, and a second number of conductive lines 104-0, 104-1, . . . , 104-M, e.g., data/sense lines, which may be referred to herein as bit lines. Coordinate axis 101 indicates that the bit lines 104-0, 104-1, . . . , 104-M are oriented in an x-direction and the word lines 102-0, 102-1, . . . , 102-N are oriented in a y-direction, in this example. As illustrated, the word lines 102-0, 102-1, . . . , 102-N are substantially parallel to each other and are substantially orthogonal to the bit lines 104-0, 104-1, . . . , 104-M, which are substantially parallel to each other; however, embodiments are not so limited. As used herein, the term "substantially" intends that the modified characteristic needs not be absolute, but is close enough so as to achieve the advantages of the characteristic. For example, "substantially parallel" is not limited to absolute parallelism, and can include orientations that are at least closer to a parallel orientation than a perpendicular orientation. Similarly, "substantially orthogonal" is not limited to absolute orthogonalism, and can include orientations that are at least closer to a perpendicular orientation than a parallel orientation.

The cross-point memory array architecture 100 can be modified to the array structure of embodiments described below in connection with FIGS. 2 and 3. The memory cells 106 in the memory array can be phase change random access memory (PCRAM) cells, resistive random access memory (RRAM) cells, conductive random access memory (CBRAM) cells, and/or spin transfer torque random access memory (STT-RAM) cells, among other types of memory cells. The memory cells 106 can have a "stack" structure that includes a select device, e.g., a switching device, coupled in series to a storage element, e.g., a resistive storage element comprising a phase change material or metal oxide. As an example, the select device can be a diode, field effect transistor (FET), a bipolar junction transistor (BJT), or an ovonic threshold switch (OTS), among other switching elements.

The select device and storage element associated with the respective memory cells 106 can be series coupled two-terminal devices. For instance, the select device can be a two-terminal OTS, e.g., a chalcogenide alloy formed between a pair of electrodes, and the storage element can be a two-terminal phase change storage element, e.g., a phase change material (PCM) formed between a pair of electrodes. Also, the bit lines 104-0, 104-1, . . . , 104-M and the word lines 102-0, 102-1, . . . , 102-N can serve as top or bottom electrodes corresponding to the memory cells 106.

In operation, the memory cells 106 of array 100 can be programmed by applying a voltage, e.g., a write voltage, across the memory cells 106 via selected conductive lines, e.g., word lines 102-0, 102-1, . . . , 102-N and bit lines 104-0, 104-1, . . . , 104-M. The width and/or magnitude of the applied potential, e.g., voltage, pulses across the memory cells 106 can be adjusted, e.g., varied, in order to program the memory cells 106 to particular logic states, e.g., by adjusting a resistance level of the storage element.

The voltage is applied to the word lines 102-0, 102-1, . . . , 102-N utilizing array circuitry 110 e.g., including access nodes, associated with each of the word lines 102-0, 102-1, . . . , 102-N. The array circuitry 110 includes a power supply coupled to an access devices 111-0, 111-1, . . . , 111-N, e.g. a transistor such as an n-type metal oxide semiconductor field effect transistor (nMOS transistor). An access transistor, e.g., 111-0, 111-1, . . . , 111-N, can be coupled to each one of the word lines 102-0, 102-1, . . . , 102-N, e.g., access device 111-N coupled to word line 102-N. The access transistor 111-0, 111-1, . . . , 111-N is capable of being in an "ON" state, e.g., conductive state, and an "OFF" state, e.g., "non" or lesser/minimally conductive state. When the access transistor 111-0, 111-1, . . . , 111-N is in an "ON" state, a voltage potential from the power supply can be transferred through the access transistor 111-0, 111-1, . . . , 111-N to a corresponding word line e.g., a word line that is coupled to the access transistor 111-0, 111-1, . . . , 111-N. When the access transistor 111-0, 111-1, . . . , 111-N is in an "OFF" state, a transfer of voltage potential from the power supply associated with the array circuitry 110 may be discontinued or cut off, e.g., the word line may be considered "floating". The word line may be considered "floating" when the access transistor 111-0, 111-1, . . . , 111-N is in an "OFF" state.

The voltage that is applied to the word lines 102-0, 102-1, . . . , 102-N can be utilized to create a floating word line. Creating the floating word line includes applying a voltage to the word lines 102-0, 102-1, . . . , 102-N to charge the word lines 102-0, 102-1, . . . , 102-N to a particular voltage e.g., +/−3 Volts (V), etc. When a word line is charged to the particular voltage, a corresponding access transistor 111-0, 111-1, . . . , 111-N is changed to the "OFF" state. As used herein, a charged word line 102-0, 102-1, . . . , 102-N is referred to as "floating" when a corresponding access transistor 111-0, 111-1, . . . , 111-N, connecting the word line 102-0, 102-1, . . . , 102-N to a power supply, is turned to the "OFF" state.

Similarly, a voltage can be applied to the bit lines 104-0, 104-1, . . . , 104-M in the array by array circuitry 108 through driving nodes 109-0, 109-1, . . . , 109-M, e.g., driving nMOS transistors, associated with each of the bit lines 104-0, 104-1, . . . , 104-M. That is array circuitry 108 can include or have access to a power supply similar to array circuitry 110. A driving transistor 109-0, 109-1, . . . , 109-M can be coupled to each one of the bit lines 104-0, 104-1, . . . , 104-M e.g., driving transistor 109-M coupled to bit line 104-M. The power supply corresponding to array circuitry 108 and the power supply corresponding to array circuitry 110 can be different power supplies where each power supply provides a different voltage. For example, power supply associated with array circuitry 110 can provide a first potential voltage, e.g., −3V, through the access transistors 111-0, 111-1, . . . , 111-N to a corresponding word line and the power supply associated with array circuitry 108 can provide a second potential voltage, e.g., +2V, through the driving transistors 109-0, 109-1, . . . , 109-M to a corresponding bit line.

A driving transistor, e.g., 109-M is capable of being in an "ON" state and an "OFF" state. When a given driving transistor, e.g., 109-M is in an "ON" state, voltage from the power supply is transferred through the driving transistor, e.g., 109-M to a corresponding bit line e.g., a bit line 104-M, that is coupled to the driving transistor, e.g., 109-M. When the driving transistor 109-M is in an "OFF" state, voltage from the power supply is not transferred through the driving transistor 109-M to the corresponding bit line 104-M.

The voltage that is applied to the bit lines 104-0, 104-1, . . . , 104-M can be utilized to sense e.g., read, a memory cell as described herein. A given driving transistor, e.g., 109-0 is put in an "ON" state when a cell 106 is to read. When the driving transistor, e.g., 109-0 is put in the "ON" state, voltage from the power supply is provided through the driving transistor, e.g., 109-0 to a corresponding bit line, e.g., 104-0. The driving transistor 109-0 remains in the "ON" state until the read is complete and then turned to an "OFF" state.

A sensing, e.g., read, operation can be used to determine the logic state of a memory cell 106. For instance, particular voltages can be applied to a bit line 104-0, 104-1, . . . , 104-M and word line 102-0, 102-1, . . . , 102-N corresponding to a selected memory cell 106, and current through the cell responsive to a resulting voltage potential difference can be sensed. Sensing operations can also include biasing unselected word lines and bit lines, e.g., word lines and bit lines coupled to non-selected cells, at particular voltages in order to sense the logic state of a selected cell 106.

As an example, the array 100 can be operated in accordance with a half select method, e.g., a half select biasing scheme. A half select method can include applying a half select voltage (V/2) where V is a power supply voltage to a selected bit line, e.g., a bit line coupled to a selected memory cell, and a negative half select voltage (−V/2) to a selected word line, e.g., a word line coupled to the selected memory cell, while biasing unselected word lines and bit lines at a reference potential, e.g., a ground potential. As such, a full select voltage (V) is applied across the selected memory cell. In this example, the unselected memory cells coupled to the selected bit line and/or selected word line experience a half select voltage of +/−V/2 and can be referred to as "half selected" cells.

For example, a given select device, e.g., driving transistor 109-M, connected to array circuitry 108 and associated with bit line 104-M, can be addressed, e.g., turned "ON" to allow current through an addressed, selected memory cell, e.g., cell experiencing the full select voltage (V) at the intersection of an addressed word line, e.g., 102-N and bit line 104-M, while other select devices, e.g., driving transistors 109-0, 109-1, etc. associated with different bit lines, e.g., 104-0, 104-1, etc., and other access nodes, e.g., 111-0, 111-1, etc., associated with different word lines, e.g., 102-0, 102-1, etc., are turned "OFF" thus blocking or limiting current through unselected cells coupled to the selected word line 102-N or bit line 104-M, e.g., cells experiencing the half select voltage. In this example, unselected memory cells coupled to both unselected bit lines, e.g., 109-0, 109-1, etc., and unselected word lines, e.g., 102-0, 102-1, etc., are unbiased, e.g., they experience a ground potential of 0V, in this example. The select voltage (V) can be a write voltage or a read voltage, for instance. Embodiments of the present disclosure are not limited to a half select method associated with programming or reading cells of array 100. For instance, the array 100 can be operated in accordance with other biasing schemes, such as a one third/ two thirds select method, among other biasing schemes.

Figure 2:
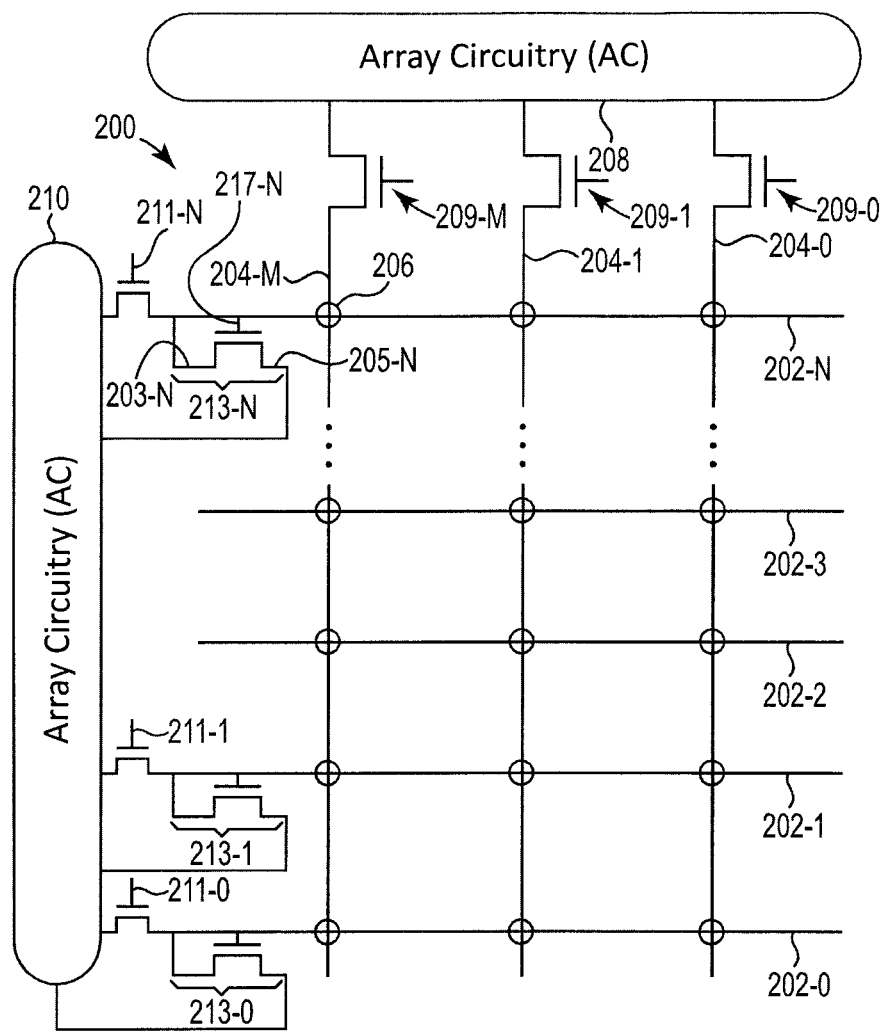
FIG. 2 illustrates a schematic diagram of a portion of a memory array in accordance with a number of embodiments of the present disclosure.

FIG. 2 illustrates a schematic diagram of a portion of a memory array 200 in accordance with a number of embodiments of the present disclosure. In this example, the memory array 200 can include a cross-point memory array architecture as described in connection with FIG. 1. As described herein, the memory cell 206 can include a variety of different memory cell types. For example, the memory cell can include phase change random access memory (PCRAM) cells, resistive random access memory (RRAM) cells, conductive random access memory (CBRAM) cells, and/or spin transfer torque random access memory (STT-RAM) cells, among other types of memory cells. The memory cells 206 of array 200 are arranged in rows coupled by access lines (e.g., word lines) 202-0 (WL0), 202-1 (WL1), 202-2, (WL2) 202-3 (WL3), . . . , 202-N (WLN) and columns coupled by sense lines (e.g., digit lines, bit lines) 204-0, 204-1, . . . , 204-M.

Memory cell structures (detail not shown) can be located at the intersection of word lines 202-0, 202-1, 202-2, 202-3, . . . , 202-N and bit lines 204-0, 204-1, . . . , 204-M. A particular array may have a number of columns of memory cells associated with sense lines (e.g., 4,096, 8,192, 16,384, etc.). The word lines 202-0, 202-1, 202-2, 202-3, . . . , 202-N and bit lines 204-0, 204-1, . . . , 204-M of the array 200 may each be coupled to sensing circuitry, e.g., 210 and 208 respectively, in accordance with a number of embodiments of the present disclosure.

As described herein array circuitry 210 is coupled through a respective access node, 211-0, 211-1, . . . , 211-N, to each of the word lines 202-0, 202-1, 202-2, 202-3, . . . , 202-N. Array circuitry 210 is associated with the word lines 202-0, 202-1, 202-2, 202-3, . . . , 202-N and includes a power supply (not shown) coupled to respective access transistors 211-0, 211-1, . . . , 211-N e.g., in a similar manner to access transistors 111-0, 111-1, . . . , 111-N as referenced in FIG. 1. Array circuitry 208 is associated with the bit lines 204-0, 204-1, . . . , 204-M can include a power supply (not shown) different from the power supply associated with array 210 and which is coupled to respective driving transistors 209-0, 209-1, . . . , 209-M e.g., in a similar manner to driving transistors 109-0, 109-1, . . . , 109-M, as referenced in FIG. 1.

However, in the example embodiment shown in FIG. 2, the array 200 also includes a stabilizing transistor 213-0, 213-1, . . . , 213-0, 213-1, . . . , 213-N associated with each word line 202-0, 202-1, 202-2, 202-3, . . . , 202-N respectively. Each stabilizing transistor 213-0, 213-1, . . . , 213-N is coupled to the power supply of the array circuitry 210 and coupled to a corresponding word line 202-0, 202-1, 202-2, 202-3, . . . , 202-N. For example, a first source/drain region, e.g., drain region 203-N, and a gate 217-N of the stabilizing transistor 213-N can both be electrically connected to the associated word line 202-N. A second source/drain region, e.g., source region 205-N, can be electrically coupled to the power supply of the array circuitry 210.

For example, the stabilizing transistor 213-N creates a feedback loop when the word line 202-N is floating, i.e., when access transistor 221-N associated with word line 202-N is turned "OFF". In certain embodiments, the stabilizing transistors 213-0, 213-1, . . . , 213-N are p-type metal oxide semiconductor field effect transistor (pMOS) transistor. Access transistors 211-0, 211-1, . . . , 211-N can be n-type metal oxide semiconductor field effect transistor (nMOS) transistors, and be located between the power supply (not shown) of the array circuitry 210 and each stabilizing transistor 213-0, 213-1, . . . , 213-N. In this example, the nMOS access transistor 211-N can be addressed and turned to an "ON" state by a positive gate potential, e.g., +2V. Once the access transistor 211-N is turned "ON", the associated word line 202-N may be charged to a particular potential, e.g., a negative potential such as −3V, provided by the power supply (not shown) of the array circuitry 210. Concurrently, the second source/drain region, e.g., source region 205-N connected to the array circuitry 210, receives the same negative potential, e.g., −3V, that is applied through the first and second source/drain region of the access transistor 211-N to the word line 202-N. Resultantly, this negative potential applied to the word line 202-N is also applied to the gate 217-N of the stabilizing transistor 213-N. Presuming that the negative potential applied to the gate 217-N of the pMOS stabilizing transistor 213-N is above the threshold Voltage (Vt) of the pMOS stabilizing transistor 213-N, then the stabilizing transistor 213-N will also be in a conductive, "ON", state. Hence, the negative potential, e.g., −3V, from the power supply of the array circuitry may be further applied to the word line 202-N through the first and second source/drain region, 203-N and 205-N of the stabilizing transistor 213-N and in this manner provides feedback of the applied negative potential, e.g., −3V, even when the access transistor 221-N is turned "OFF", i.e., referred to herein as when word line is floated. That is, the voltage placed on the word line 202-N e.g., voltage to which the particular word line was charged before the access transistor 211-N was turned "OFF", will be received at the gate 217-N of the stabilizing transistor and work to maintain the pMOS transistor 213-N in an "ON" state through a feedback loop.

As described herein, the array circuitry 210 can be utilized to charge a corresponding word line to a particular voltage, e.g., −3V. When the corresponding word line is charged to the particular voltage, the access transistor, e.g., 211-N, is switched to an "OFF" state. As used herein, once the access transistor, e.g., 211-N, is turned "OFF" the associated word line, e.g., 202-N, is referred to as "floating". Once the word line is floating, e.g., access transistor 211-N turned "OFF", there can be current leakage and capacitive coupling with neighboring word lines and bit lines in the array 200 that causes a change of the particular voltage applied to the word line 202-N. Again, the word line is referred to herein as "floating" when the word line is charged to a particular, intended voltage using the access transistor 211-N and the access transistor 211-N is then switched to an "OFF" state.

As noted, the leakage can be caused by capacitive coupling to neighboring word lines and bit lines and current leakage to neighboring cells in the array 200. The greater the potential applied to a given bit line and/or word line can accelerate and/or increase the speed and/or amount of leakage. Capacitive coupling with the bit lines 204-0, 204-1, ..., 204-M can occur due to a voltage provided to the bit lines, e.g., 204-0, 204-1, ..., 204-M, during a pre-charge stage (discussed further below in connection with FIG. 3B). The pre-charge stage of the bit lines 204-0, 204-1, ..., 204-M can further exacerbate the problem of the leakage. In result, the leakage can change the particular voltage of the word line 202-N over a period time prior to reading the cell 206.

The leakage from the word lines 202-0, 202-1, 202-2, 202-3, ..., 202-N and capacitive coupling with the bit lines 204-0, 204-1, ..., 204-M can cause a number of problems for the reading of the cell 206. The number of problems can include lowering potential difference, e.g., a gap voltage (also referred to as "voltage gap"), between a particular selected word line, e.g., 202-N, and a particular selected bit line, e.g., 204-1, during a read of the cell 206. To prevent the gap voltage from being altered due to the leakage, the feedback loop that is implemented by the stabilizing transistors 213-0, 213-1, ..., 213-N can utilize the power supply of the array circuitry 210 to work to maintain the particular voltage on a particular e.g., addressed, word line 202-N until a read regime operation e.g., snap back (as described in more detail herein).

That is, the feedback loop provided by the stabilizing transistor 213-0, 213-1, ..., 213-N refreshes or works to maintain the floating word line 202-N at the intended potential, e.g., at the initially provided −3V, even while leakage may be occurring. For example, if the stabilizing transistor 213-N is a pMOS transistor and the floated word line is placed at a voltage potential of −3V, then the negative voltage potential applied to the gate 217-N of the stabilizing transistor 213-N turns the stabilizing transistor to an "ON" state and the same negative voltage potential of −3V from the array circuitry 210 works to maintain the floated word line at that potential until a read regime operation.

The word line 202-0, 202-1, 202-2, 202-3, ..., 202-N is described as "floating" when the access transistor is in an "OFF" state even when the stabilizing transistor 213-0, 213-1, ..., 213-N is in the "ON" state. That is, a voltage is applied to the word line 202-0, 202-1, 202-2, 202-3, ..., 202-N, via a power supply when the access transistor is in an "ON" state. When the access transistor is changed to an "OFF" state, the word line is referred to as "floating". The word line is still described as "floating" even though the stabilizing transistor 213-0, 213-1, ..., 213-N reacts to the negative potential, e.g., −3V, applied to its gate 217-N, from the word line, e.g., 202-N, and changes from an "OFF" state to an "ON" state. And further, the word line, e.g., 202-N, is still described as floating when the stabilizing transistor, e.g., 213-N is in an "ON" state and the power supply voltage, e.g., −3V, is applied through the stabilizing transistor 213-N to the word line 202-N. In the read regime, the stabilizing transistor 213-N is over powered e.g., saturated, and conduction through the stabilizing transistor 213-N is effectively closed e.g., cut off, as will be described in more detail below in connection with FIG. 3B.

As stated, the stabilizing transistor, e.g., 213-N, can remain in the "ON" state and provide voltage to a selected word line, e.g., 202-N, until a read operation occurs. When the read operation occurs (e.g., in a read regime discussed in connection with FIG. 3B), a selected bit line, e.g., 204-1, is provided with an oppositely biased voltage. For example, a positive voltage potential, e.g., +2V, is provided to the bit line 204-1 creating a desired gap voltage between the selected word line 202-N and the selected bit line 204-1 in an intermediate regime. In the read regime, the potential difference between the selected word line 202-N and the selected, e.g., "driven" bit line 204-1—may cause an addressed cell at the intersection of the selected word line 202-N and the driven bit line 204-1 to conduct pulling the potential on the selected word line 202-N toward the potential on the bit line 204-1, also referred to as "snap back". This occurrence can effectively cut off the stabilizing transistor 213-N when snap back occurs.

Maintaining e.g,. providing voltage via the stabilizing transistor 213-N, the particular voltage of the selected word line 202-N stabilizes the gap voltage, e.g., potential difference, between the particular voltage of the selected word line 202-N and a voltage provided by the driving node to the selected bit line 204-1 during a read operation of the cell 206 when the word line 202-N is referred to as floating due to the access node 211-N being turned "OFF". Stabilizing the gap voltage can enable a more accurate read of the memory cell 206.

Figure 3B:
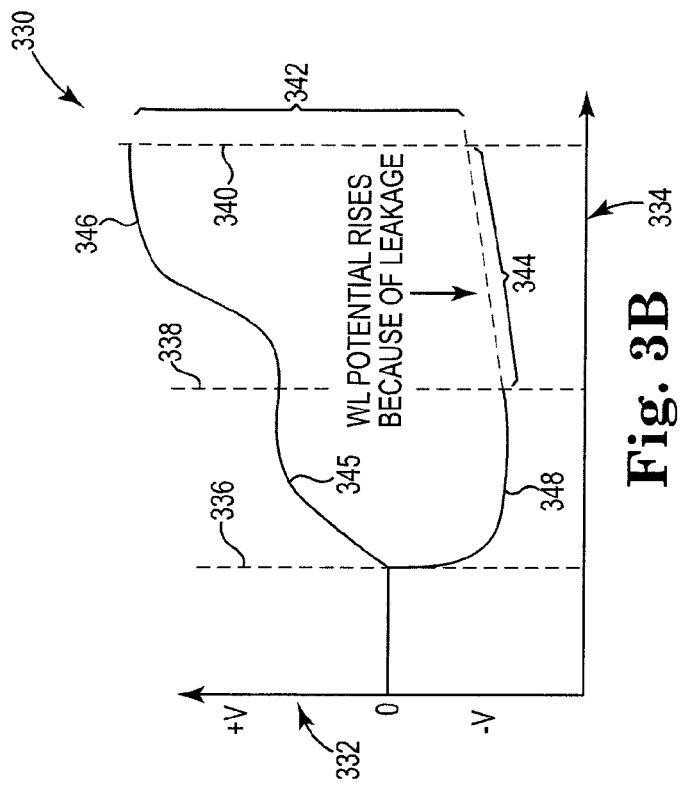
FIG. 3B illustrates a graphical representation of a number of regime changes for operation of a cross point memory array architecture, with and without a stabilizing transistor in accordance with a number of embodiments of the present disclosure.
Figure 3A:
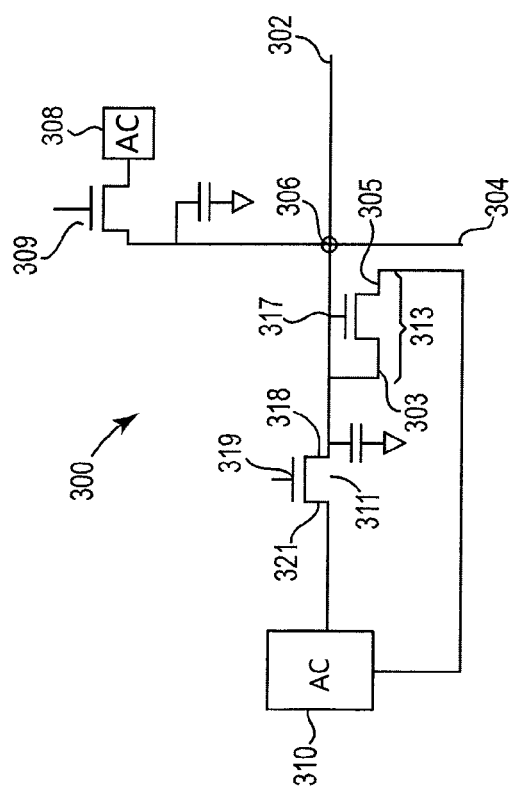
FIG. 3A illustrates a schematic diagram of a portion of a memory array in accordance with a number of embodiments of the present disclosure.

FIG. 3A illustrates a schematic diagram of a portion of a memory array 300 in accordance with a number of embodiments of the present disclosure. As described herein, an array 300 includes a word line 302 that intersects a bit line 304 in a cross point memory array. As described herein, the word line 302 is connected to array circuitry 310 that includes access to a power supply and connects with an access transistor 311 for a given word line 302. The access transistor 311 has a first source/drain region, e.g., source region 321, and second source/drain region, e.g., drain region 318. When the access transistor 311 is turned "ON" by a potential applied to its gate 319, the access transistor provides a particular voltage potential to the word line 302.

As described herein, a stabilizing transistor 313 is provided to maintain the particular voltage potential on the word line 302, e.g., prevent leakage effect or compensate for leakage. The stabilizing transistor 313 has a gate 317 connected to the word line 302, a first source/drain region, e.g., source region 305, which can be connected to the power supply from the array circuitry 310, and a second source/drain region 303, e.g., drain region 303, which is connected to the word line 302 between the access transistor 311 and the gate 317 of the stabilizing transistor 313. In one embodiment, the access transistor 311 is an nMOS transistor and the stabilizing transistor 313 is a pMOS transistor.

As described herein, capacitive coupling and current leakage can occur after the word line 302 is floating, i.e., once the access transistor 311 is turned "OFF". In operation, the word line 302 can be charged to a particular voltage, e.g., −3V, and then the access transistor 311 can be switched to an "OFF" state. At this time, the word line is charged at the particular voltage and is considered floating. When the bit line 304 is in a pre-charge regime (described in connection with FIG. 3B) the bit line 304 is provided a predetermined, first amount of voltage potential, e.g., +1−2V, from a power supply associated with array circuitry 308 through the driving transistor 309. During the pre-charge regime (shown as 344 in FIG. 3B) current may leak from bit line 304 and floating word line 302 through a memory cell 306 at the intersection of the floating word line 302 and the bit line 304. Capacitive coupling between neighboring word lines and bit lines will also be occurring. This capacitive coupling and current leakage can change the potential difference, e.g., gap voltage, between the intended particular voltage on the floating word line 302 and the voltage potential applied to the bit line 304. In some embodiments, this leakage from the floating word line 302 causes the particular voltage on the floating word line 302 to become more positive, e.g., the negative potential of −3V applied to the word line 302 becomes more positive and the gap voltage decreases.

As described herein, when the stabilizing transistor 313 is in the "ON" state, e.g., having a −3V applied to gate 317 of the pMOS from the word line 302, voltage from the power supply is applied through the stabilizing transistor 313 to the word line 302 in a feedback manner. The voltage that is applied through the stabilizing transistor 313 works to compensate for the leakage effect and attempts to maintain the voltage on the word line 302 at an intended voltage potential level, e.g., close to the intended −3V, that may otherwise change more significantly due to leakage occurring, e.g., due to capacitive coupling and current leakage.

As described herein, the bit line 304 can be coupled to array circuitry 308 that has access to a power supply and can be connected to a driving device 309 e.g., driving node or a driving transistor 309. As discussed in more detail in connection with FIG. 3B, the driving transistor 309 can be switched to a "ON" state and pre-charge voltage potential, e.g., +1V, from a power supply associated with the array circuitry 308 will be provided to the bit line 304 in a pre-charge regime. In other words, when the driving transistor 309 is "ON", a positive voltage potential is provided from the power supply associated with array circuitry 308 to the bit line 304 that is different in magnitude and bias than the voltage potential applied to the word line 302 through the access node 311 from the power supply associated with array circuitry 310. For example, in some embodiments, the power supply coupled to the word line 302 provides a voltage that is equal to −3V and the power supply coupled to the bit line 304 provides a voltage that is equal to +1V. Then in an intermediate regime, the power supply associated with array circuitry 308 is ramped up further, e.g., another +1V, to provide a higher positive voltage potential, e.g., +2V, to the bit line 304. In this example embodiment the gap voltage is intended to be 5V across a memory cell, e.g., a PCM cell, in a read operation for "snap back" to occur in a read regime. Hence, if in this example a 5V gap voltage is intended, without leakage, then the stabilizing transistor 313 described herein works to compensate for the leakage effect and attempts to maintain the voltage on the word line 302 at −3V in an effort to maintain the intended gap voltage of 5V for a more accurate read operation at snap back despite any leakage that may occur.

As the reader will appreciate, for the gradual change in voltage on the word line 302 caused by the leakage e.g., drift to a more positive voltage potential, the feedback loop provided by the stabilizing transistor 313 works to compensate for the leakage effect and attempts to return the voltage on the word line 302 toward a −3V. Conversely, in the read regime the addressed cell 306 may conduct and snap back may occur pulling the voltage potential up toward the voltage potential on the bit line, e.g., pulling the word line up toward zero voltage potential (0V), +1V, etc., depending a particular intended operation parameters. This more sudden increase toward a greater positive potential on the word line 302 will also be realized at the gate 317 of the stabilizing transistor 313 during the read operation and can drop the potential at the gate 317 below a threshold voltage for the pMOS stabilizing transistor 313, effectively moving the stabilizing transistor 313 to an "OFF" state. Embodiments of the present disclosure are not limited to device and/or transistor size, type or particular applied voltage ranges. That is, the various components, including the stabilizing transistor 313, can be customized to suit a particular application and/or implementation.

FIG. 3B illustrates an example graphical representation 330 of a number of regime changes in accordance with a number of embodiments of the present disclosure. The graphical representation 330 represents an applied voltage potential value on the y-axis 332 and time on the x-axis 334. The graphical representation 330 illustrates voltage values over a period of time for a word line and for a bit line without a stabilizing transistor e.g., without a stabilizing transistor 313 according to the embodiments of the present disclosure, as may be applied in operation of cross point memory array architecture. The graphical representation illustrates the voltage values of the word line (word line 302 in FIG. 3A) with line 348 and illustrates the voltage values of the bit line (bit line 304 in FIG. 3A) with line 346.

At the point in time 336 an access device e.g., access transistor 311, is turned on and a power supply voltage, associated with array circuitry 310, is applied to the word line 302 through access transistor 311 as part of a pre-charge regime for cross point array operation. In FIG. 3B, the pre-charge regime begins at a representation in time indicated by vertical dashed line 336. The pre-charge regime includes utilizing a first power supply associated with array circuitry 310 to provide a particular, desired voltage potential 348 to the word line (e.g., 302 in FIG. 3A) through the access transistor 311 while the access transistor is turned "ON". Concurrently, in the pre-charge regime a "pre-charge" voltage 345 is provided to the bit line (e.g., 304 in FIG. 3A) utilizing a second power supply associated with array circuitry 308 through the driving transistor 309 while the driving transistor is turned "ON". The graphical representation 330 illustrates an example where the first power supply associated with array circuitry 310 charges the word line to a particular negative voltage potential 348 (−V), e.g., −2V, −3V, etc. The graphical representation 330 also illustrates an example where a second power supply associated with array circuitry 308 oppositely biases the bit line to a positive "pre-charge" voltage potential +V, e.g., +1V, +2V, etc.

An intermediate regime, in this example, begins at point in time represented at 338. Here, the word line 302 is floated, meaning the word line is disconnected from the power supply associated with array circuitry 310 as the access transistor 311 is turned "OFF". At this point in time 338 the word line 302 has been charged to the particular, desired negative voltage potential 348, e.g., −2V, −3V, etc. Additionally, in the intermediate regime the second power supply associated with array circuitry 308 can be ramped up to a higher positive voltage potential ("ramped voltage potential") 346, e.g., +2V, +3V, etc. However, as shown by the dashed line (- - -) in FIG. 3B, during the intermediate regime e.g., time period between point 338 and point 340, leakage can occur from current leakage to neighboring cells and capacitive coupling between neighboring bit lines and word lines to a memory array. The dashed line (- - -) in the graphical representation 330 of FIG. 3B illustrates the slight increase toward a more positive voltage potential on the word line 302 during the intermediate regime due to the leakage at 344. As described herein, this dashed line (- - -) graphical representation 330 illustrates the change toward a more positive voltage potential of a word line without a stabilizing transistor from the particular, desired negative voltage potential 348 applied to the word line in the pre-charge regime. With or without the stabilizing transistor according to embodiments of the present disclosure, leakage can occur. Without the stabilizing transistor (e.g., 313 in FIG. 3A) the gap voltage 342 between the word line 302 and the bit line 304 may narrow, e.g., decrease, unacceptably during the intermediate regime and result in inaccurate cell reads. However, the feedback loop provided through use of the stabilizing transistor (313 in FIG. 3A) as described herein can help to compensate for the leakage and can prevent the leakage effect, e.g. the narrowing of the gap voltage 342, by reducing or preventing the magnitude of change toward a more positive voltage potential on the word line 302 illustrated by the dashed line (- - -).

In a read operation of an addressed cell in a cross point memory array may result in conduction across the cell, e.g., PCM cell, which results in pulling the voltage potential of the word line even more positive, e.g., toward zero volts (0V), +1V, etc. This can also be referred to as "snap back" in the read operation of a cross point memory array. While not discussed in more detail herein, a "snap-back" may occur at point 340 once the bit line 304 has been ramped up to the higher positive voltage potential 346, e.g., +2V, +3V, etc. Hence, the better an intended gap voltage 342 across the cell can be maintained the more accurate a read of a given cell is likely to be. The graphical representation shows a gap voltage 342 at the snap-back, which may be less than intended without the stabilizing transistor according to embodiments of the present disclosure. As described herein, the gap voltage 342 may need to be a predetermined value e.g., 5V, 4V, to ensure a correct read of the memory cell. The increase in the voltage on the word line, caused by leakage, can unacceptably decrease the gap voltage 342. Alternative approaches, such as altering a magnitude of the voltage potential supplied to the word line, e.g., to −3V, −4V, etc., without implementing the stabilizing transistor 313, e.g., feedback circuit, shown in FIG. 3A, may only increase the leakage rate and consequently may not compensate for or prevent the leakage effect, e.g., decrease in the gap voltage 342. That is, simply augmenting the magnitude of the voltage potential supplied, without using the stabilizing transistor 313 of the present embodiments, may just cause the gap voltage 342 to decrease at a faster rate of time compared to the rate displayed in the graphical representation 330 and not work any better to maintain and intended gap voltage. For example, if the word line in FIG. 3B were charged to a voltage of −3V, the drift toward a more positive potential due to leakage will occur at a faster rate compared to a word line that is charged to a voltage of −2V. Additionally altering a magnitude of the voltage supplied to the bit line e.g., 4V, 5V, etc., results in a comparable increase the leakage rate and consequently may not preclude, meaningfully, the decrease in the gap voltage 342. That is, a drift toward a less positive potential, e.g., than that shown at an intended voltage potential 346 on the bit line 304 in the intermediate regime 344, may only occur at a faster rate and amount if the bit line were charged to even higher positive voltage potentials compared to that shown in the graphical representation 330.

Implementing a stabilizing transistor, as described herein, provides voltage from the first power supply associated with array circuitry 310 during the intermediate regime 344 to compensate for and prevent the leakage effect caused by leakage, e.g., narrowing of gap voltage. Advantageously, using a stabilizing transistor 313 as described herein, an increase in a magnitude of a negative voltage potential supplied to the word line may not result in the above described increase in the rate of leakage and consequently may preclude or compensate for an increase in the rate that the gap voltage decreases. That is, the stabilizing transistor can work to reduce a magnitude of change in the voltage applied to a word line caused by leakage once the access transistor is turned "OFF" even for embodiments where the magnitude of the voltage potential supplied to the word line is increased.

Figure 4:
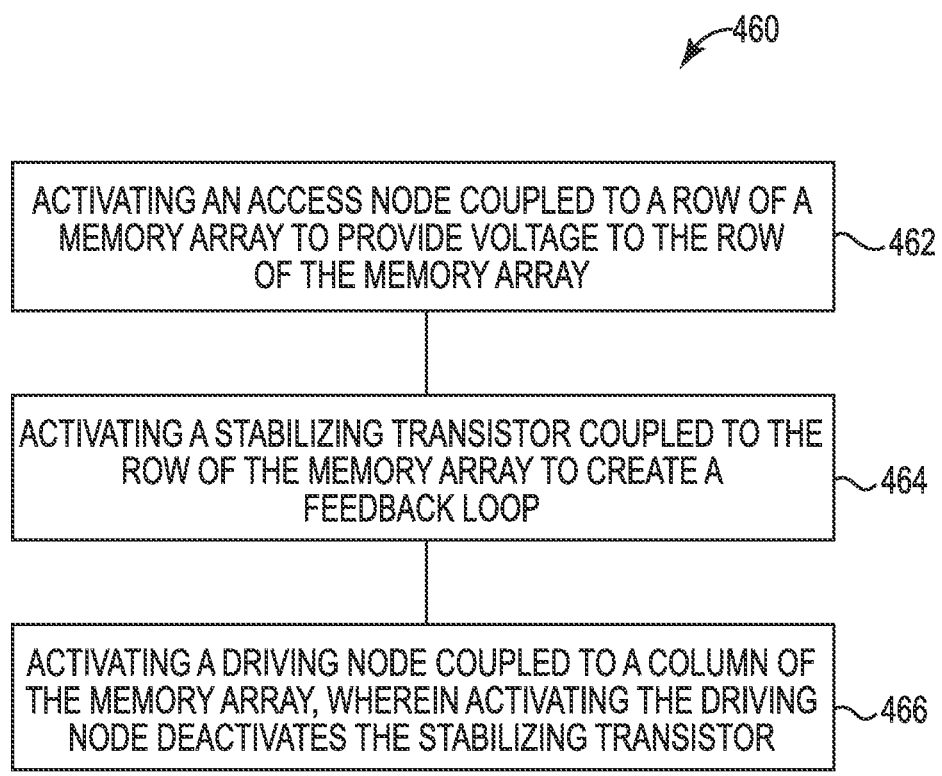
FIG. 4 illustrates a method for memory line stabilization in accordance with a number of embodiments of the present disclosure.

FIG. 4 illustrates a method 460 for memory line stabilization in accordance with a number of embodiments of the present disclosure. Memory line stabilization can include utilizing a stabilizing transistor as described herein. Memory line stabilization can work to maintain a particular voltage applied to a conductive line (e.g., access line, word line, etc.) even once an access transistor initially providing the particular voltage potential to the word line is turned "OFF". At 462 the method 460 can include activating an access node coupled to a row of a memory array to provide voltage to the row of the memory array. Activating the access node coupled to the row of the memory array can include switching an access transistor to an "ON" state and providing voltage to the word line of the memory array, as described herein. As described herein, the access node can connect a first power supply associated with array circuitry to the word line in order to provide a particular voltage potential to the word line. The access node can provide an intended, predetermined voltage to the word line before the access node is switched to an "OFF" state as described herein.

That is, activating the access node can include connecting a first power supply to the row of the memory array to charge the row of the memory array to a particular voltage. The access node can be deactivated when the row of the memory array is charged to the particular voltage. Deactivating the access node can provide a demarcation of an intermediate regime of operation in the operation of a cross point memory array architecture. As described herein, the intermediate regime, e.g., intermediate regime shown as 344 in FIG. 3B, can be a period when an access node associated with the word line has been switched to an "OFF" state. During the intermediate regime a voltage applied to the word line in a pre-charge regime of operation can change due to leakage.

At 464 the method 460 can include activating a stabilizing transistor coupled to the row of the memory array to create a feedback loop. Activating a stabilizing transistor to create a feedback loop includes using the first power supply that initially applied the particular voltage potential to the word line when the access node was in an "ON" state. According to embodiments, the particular voltage potential initially applied to the row when the access node was "ON" includes a voltage level greater that a threshold voltage (Vt) of the stabilizing transistor and can be coupled to the gate of the stabilizing transistor so as to activate the stabilizing transistor can and switch the stabilizing transistor to an "ON" state. The stabilizing transistor e.g., pMOS transistor, can utilize the first power supply to continue applying the first power supply voltage to the row, and work to maintain the word line at or near the particular voltage, via the feedback loop even once the access node is turned "OFF", e.g., deactivated.

Maintaining the particular voltage of the row via the feedback loop can also maintain a gap voltage. As described herein, the gap voltage can be an intended difference between a particular voltage of applied to the word line and a voltage applied to the bit line during a read operation.

At 466 the method 460 can include activating a driving node coupled to a column of the memory array, wherein activating the driving node deactivates the stabilizing transistor when the column reaches a ramped voltage potential level. Activating the driving node can initiate a demarcation of a read operation of a memory cell in the operation of a cross point memory array. As described herein, activating the driving node can include connecting a second power supply to the bit line of the memory array, the second power supply providing a "pre-charge" voltage potential and then a "ramped voltage potential" to the column. The stabilizing transistor is deactivated once the column reaches the ramped voltage potential. The driving node can deactivate the stabilizing transistor when an addressed cell at the intersection of a selected row and the driven column conducts during a read operation pulling the potential on the selected row toward the potential on the driven column, e.g., an event also referred to as "snap back". This occurrence can effectively cut off the stabilizing transistor when snap back occurs. Stated differently, snap back may cause a sudden change in the voltage potential on the row which may also be realized at a gate of the stabilizing transistor coupled thereto. This change during the read operation and can drop the potential at the gate below a threshold voltage for the stabilizing transistor, effectively switching the stabilizing transistor to an "OFF" state.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A memory apparatus, comprising:
   an array of memory cells, wherein the memory cells are coupled at an intersection of a number of access lines and a number of sense lines of the array;
   an access device configured to control application of a first voltage, provided by a first power supply, to an access line coupled to an access line in the array to provide a first voltage to the access line utilizing a first power supply;
   a driving device coupled to a sense line in the array to provide a second voltage to the sense line utilizing a second power supply; and
   a stabilizing transistor coupled to the access line in the array to react to a change from the first voltage to the second voltage and maintain an intended voltage on the access line utilizing the first power supply when the access device is deactivated.

2. The apparatus of claim 1, wherein the access device is an nMOS transistor coupled to the first power supply.

3. The apparatus of claim 1, wherein the stabilizing transistor provides a feedback loop to the access line during an intermediate regime operation on the array.

4. The apparatus of claim 1, wherein the intermediate regime operation occurs between a pre-charge regime operation and a snap back regime operation for a cross point memory array.

5. The apparatus of claim 1, wherein the first power supply provides a voltage that is of a different magnitude and bias than the second power supply.

6. The apparatus of claim 1, wherein the stabilizing transistor remains active in an "ON" state after the access device is switched to an "OFF" state.

7. The apparatus of claim 6, wherein the stabilizing transistor is switched to an "OFF" state when a snap back regime operation occurs.

8. The apparatus of claim 1, wherein the stabilizing transistor is deactivated when the driving device applies a particular voltage potential to the bit line.

9. A memory apparatus, comprising:
   an array of memory cells, wherein the memory cells are coupled at an intersection of a number of access lines of the memory array and a number of sense lines of the memory array;
   a first transistor coupled to an access line of the memory array and coupled to a first power supply, wherein the first transistor provides a voltage from the first power supply to the access line to pre-charge the access line of the memory array;
   a second transistor coupled to a sense line of the memory array and coupled to a second power supply, wherein the second transistor provides voltage from the second power supply to the sense line when activated; and
   a stabilizing transistor coupled to the access line of the memory array and coupled to the first power supply, wherein the stabilizing transistor includes a gate that is coupled to the access line of the memory array, and wherein the stabilizing transistor remains "ON" when the first transistor is deactivated.

10. The apparatus of claim 9, wherein the stabilizing transistor is activated when the access line is pre-charged.

11. The apparatus of claim 10, wherein the stabilizing transistor utilizes the first power supply to maintain a charge on the access line of the memory array within a predetermined voltage range when the first transistor is deactivated.

12. The array of claim 10, wherein the stabilizing transistor creates as a feedback loop for the access line.

13. The array of claim 12, wherein the feedback loop maintains a charge of the corresponding access line when the charge of the corresponding access line is being altered within a particular range.

14. The array of claim 12, wherein the feedback loop of the provided by the stabilizing transistors is deactivated when a change in a charge of the corresponding access line exceeds a threshold.

15. A method of memory line stabilization:
   activating an access device coupled to a row of a memory array to provide voltage to the row of the memory array;
   activating a stabilizing transistor coupled to the row of the memory array to create a feedback loop, wherein activating the stabilizing transistor includes reacting to a change in voltage to the row of the memory array; and
   activating a driving device coupled to a column of the memory array, wherein activating the driving device deactivates the stabilizing transistor at a ramped voltage potential.

16. The method of claim 15, wherein the stabilizing transistor connects the first power supply to the row of the memory array when the row of the memory array is pre-charged to a level that exceeds a threshold voltage of stabilizing transistor.

17. A method of memory line stabilization:
   activating an access device coupled to an access line of a memory array to connect a first power supply to the access line of the memory array;
   deactivating the access device coupled to the access line of the memory array when the access line has a particular voltage;
   activating a stabilizing transistor coupled to the access line of the memory array using the particular voltage on the access line; and
   activating a driving device coupled to a sense line of the memory array to connect a second power supply to the sense line of the memory array first at a pre-charge voltage potential and then a ramped voltage potential, wherein activating the driving device deactivates the stabilizing transistor at the ramped voltage potential.

18. The method of claim 17, wherein deactivating the access device provides a demarcation of an intermediate regime of operation in the operation of a cross point memory array architecture.

19. The method of claim 18, wherein activating the stabilizing transistor activates a feedback loop to maintain the particular voltage during the intermediate regime.

20. The method of claim 18, wherein the intermediate regime includes a time period between charging the access line of the memory array and activating the driving device.

21. The method of claim 17, wherein activating the driving device deactivates the stabilizing transistor when conduction through a cell pulls a voltage potential of the access line, and applied to a gate of the s stabilizing transistor, to a more positive potential below a threshold voltage (Vt) of the stabilizing transistor to effectively turns the stabilizing transistor "OFF" during a read regime.

22. The method of claim 17, wherein activating the stabilizing transistor to maintain the particular voltage of the access line of the memory array includes maintaining a particular gap voltage between the voltage of the access line and a voltage of the sense line.

23. A method of memory line stabilization:
activating an access device coupled to a row of a memory array to provide voltage to the row of the memory array, wherein activating the access device includes connecting a first power supply to the row of the memory array to charge the row of the memory array to a particular voltage, wherein the access device is deactivated when the row of the memory array is charged to the particular voltage;
activating a stabilizing transistor coupled to the row of the memory array to create a feedback loop; and
activating a driving device coupled to a column of the memory array, wherein activating the driving device deactivates the stabilizing transistor at a ramped voltage potential.

24. The method of claim 23, wherein activating the access device to provide voltage to the row of the memory array activates the stabilizing transistor and provides the feedback loop to the row of the memory array utilizing the first power supply to maintain the particular voltage to the row of the memory array.

25. The method of claim 24, wherein activating the driving device deactivates the stabilizing transistor in response to the driving device connecting a second power supply to the column of the memory array at the ramped voltage potential.

26. The method of claim 23, wherein the second power supply provides a greater voltage than the first power supply.

27. A method of memory line stabilization:
activating an access device coupled to a row of a memory array to provide voltage to the row of the memory array;
activating a stabilizing transistor coupled to the row of the memory array to create a feedback loop, wherein activating the stabilizing transistor includes reacting to a change in voltage to the row of the memory array; and
activating a driving device coupled to a column of the memory array, wherein activating the driving device deactivates the stabilizing transistor at a ramped voltage potential and initiates a demarcation of a read operation in the operation of a cross point memory array architecture.

* * * * *